US012564080B2

(12) United States Patent
Kim

(10) Patent No.: US 12,564,080 B2
(45) Date of Patent: Feb. 24, 2026

(54) MEMORY MODULE HAVING FIRST CONNECTION BUMPS AND SECOND CONNECTION BUMPS

(71) Applicant: SAMSUNG ELECTRONICS CO., LTD., Suwon-si (KR)

(72) Inventor: Wonyoung Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 633 days.

(21) Appl. No.: 17/930,942

(22) Filed: Sep. 9, 2022

(65) Prior Publication Data

US 2023/0178468 A1 Jun. 8, 2023

(30) Foreign Application Priority Data

Dec. 8, 2021 (KR) ........................ 10-2021-0174812

(51) Int. Cl.
  *H01L 23/498* (2006.01)
  *H01L 23/00* (2006.01)
  *H01L 25/10* (2006.01)

(52) U.S. Cl.
  CPC .. *H01L 23/49838* (2013.01); *H01L 23/49816* (2013.01); *H01L 23/49833* (2013.01);
  (Continued)

(58) Field of Classification Search
  CPC ......... H01L 23/49816; H01L 23/49838; H01L 24/17; H01L 21/4853; H01L 21/563; H01L 23/49833; H01L 24/16; H01L 24/32; H01L 24/48; H01L 24/73; H01L 2224/16148; H01L 2224/16227; H01L 2224/32145; H01L 2924/1434; H01L 2225/06506;
(Continued)

(56) References Cited

U.S. PATENT DOCUMENTS 5,710,071 A   1/1998  Beddingfield et al.
7,795,743 B2  9/2010  Kim et al.
(Continued)

FOREIGN PATENT DOCUMENTS

EP    0814511 A2   12/1997
JP    H1056102 A    2/1998
(Continued)

*Primary Examiner* — Khiem D Nguyen
(74) *Attorney, Agent, or Firm* — Wolf, Greenfield & Sacks, P.C.

(57) ABSTRACT

A memory module, includes a module substrate and at least one semiconductor package on the module substrate that includes a package substrate having a lower surface and an upper surface. First and second groups of lower pads are on the lower surface, and upper pads are on the upper surface and are electrically connected to the lower pads of the first group. A chip structure is on the upper surface of the package substrate and is electrically connected to the upper pads. First connection bumps connect the lower pads of the first group to the module substrate, and second connection bumps connect the lower pads of the second group to the module substrate. The first connection bumps have a first maximum width at a first distance from the package substrate, and the second connection bumps have a second maximum width at a second, shorter distance from the package substrate.

20 Claims, 8 Drawing Sheets

(52) U.S. Cl.
CPC ........ *H01L 23/49866* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/16148* (2013.01); *H01L 2224/16227* (2013.01); *H01L 2224/32145* (2013.01); *H01L 2224/32225* (2013.01); *H01L 2224/48227* (2013.01); *H01L 2224/73204* (2013.01); *H01L 2224/73215* (2013.01); *H01L 2224/73265* (2013.01); *H01L 2924/1434* (2013.01)

(58) Field of Classification Search
CPC ... H01L 2225/0651; H01L 2225/06513; H01L 2225/06517; H01L 25/105
See application file for complete search history.

(56) References Cited

U.S. PATENT DOCUMENTS

| | | | |
|---|---|---|---|
| 9,406,600 B2 | 8/2016 | Kudo | |
| 9,711,470 B2 * | 7/2017 | Yu ........................ | B23K 35/001 |
| 9,985,008 B2 | 5/2018 | Shi et al. | |
| 10,950,586 B2 * | 3/2021 | Cho ................... | H01L 23/49866 |
| 11,011,477 B2 | 5/2021 | Shi et al. | |
| 2007/0152350 A1 * | 7/2007 | Kim ..................... | H05K 3/3436 |
| | | | 438/666 |
| 2012/0032328 A1 | 2/2012 | Lin et al. | |
| 2013/0292833 A1 * | 11/2013 | Won .................... | H01L 23/3128 |
| | | | 257/738 |
| 2014/0193951 A1 * | 7/2014 | Kwon .................... | H01L 24/81 |
| | | | 438/107 |
| 2014/0299980 A1 * | 10/2014 | Choi .................... | H01L 23/481 |
| | | | 257/698 |
| 2016/0247761 A1 * | 8/2016 | Song .................... | H01F 41/063 |
| 2017/0162555 A1 * | 6/2017 | Jo ........................... | H01L 24/81 |
| 2021/0320077 A1 * | 10/2021 | Seo ........................ | H01L 24/13 |

FOREIGN PATENT DOCUMENTS

| | | | |
|---|---|---|---|
| KR | 20000040592 | A | 7/2000 |
| KR | 100541397 | B1 | 5/2006 |
| KR | 10-1892876 | B1 | 8/2018 |
| KR | 10-2021-0047605 | A | 4/2021 |
| KR | 10-2021-0131548 | A | 11/2021 |

* cited by examiner

200a

200b

MEMORY MODULE HAVING FIRST CONNECTION BUMPS AND SECOND CONNECTION BUMPS

CROSS-REFERENCE TO RELATED APPLICATION

This application claims the priority and benefit of Korean Patent Application No. 10-2021-0174812, filed on Dec. 8, 2021, with the Korean Intellectual Property Office, the disclosure of which is incorporated herein by reference in its entirety.

BACKGROUND

1. Field

The present inventive concept relates to memory modules.

2. Description of Related Art

In a data processing system such as a personal computer (PC), a server computer, or the like, a memory module in which a plurality of semiconductor packages (e.g., memory packages) are mounted on a module substrate is used as a data storage device. Heat generated by a plurality of semiconductor packages operating at high speed may cause performance degradation of the memory module.

SUMMARY

An aspect of the present inventive concept is to provide memory modules having improved heat dissipation characteristics.

According to an aspect of the present inventive concept, a memory module includes a module substrate, and at least one semiconductor package on the module substrate. The at least one semiconductor package includes a package substrate having a lower surface and an upper surface. First and second groups of lower pads are on the package substrate upper surface, and upper pads are on the package substrate upper surface and are electrically connected to the lower pads of the first group. A chip structure is on the package substrate upper surface and is electrically connected to the upper pads. An encapsulant seals at least a portion of the chip structure. First connection bumps connect the lower pads of the first group to the module substrate, and second connection bumps connect the lower pads of the second group to the module substrate. The first connection bumps each have a first maximum width at a first distance from the package substrate lower surface, and the second connection bumps each have a second maximum width at a second distance from the package substrate lower surface, wherein the second distance is shorter than the first distance.

According to an aspect of the present inventive concept, a memory module includes a module substrate, and at least one semiconductor package on the module substrate. The at least one semiconductor package includes a package substrate having a lower surface and an upper surface. First and second groups of lower pads are on the package substrate lower surface. Upper pads are on the package substrate upper surface and are electrically connected to the lower pads of the first group. A chip structure is on the package substrate upper surface and is electrically connected to the upper pads. First connection bumps connect the lower pads of the first group to the module substrate, each of the first connection bumps having a first maximum width. Second connection bumps connect the lower pads of the second group to the module substrate, each of the second connection bumps having a second maximum width. The first maximum width of each first connection bump is at a first distance from the lower surface of the package substrate, and the second maximum width of each second connection bump is at a second distance from the lower surface of the package substrate. The second distance is different from the first distance.

According to an aspect of the present inventive concept, a memory module includes a module substrate including first and second landing pads, a package substrate on the module substrate, the package substrate having an upper surface and a lower surface. First and second groups of lower pads are on the package substrate lower surface, and upper pads are on the package substrate upper surface. The upper pads are electrically connected to the lower pads of the first group. A chip structure is on the package substrate upper surface and is electrically connected to the upper pads. First connection bumps connect the lower pads of the first group to the first landing pads of the module substrate, and second connection bumps connect the lower pads of the second group to the second landing pads of the module substrate. Each of the second connection bumps has a convexly shaped upper portion extending from a lower pad of the second group, and a lower portion extending from the upper portion to the upper surface of the module substrate.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
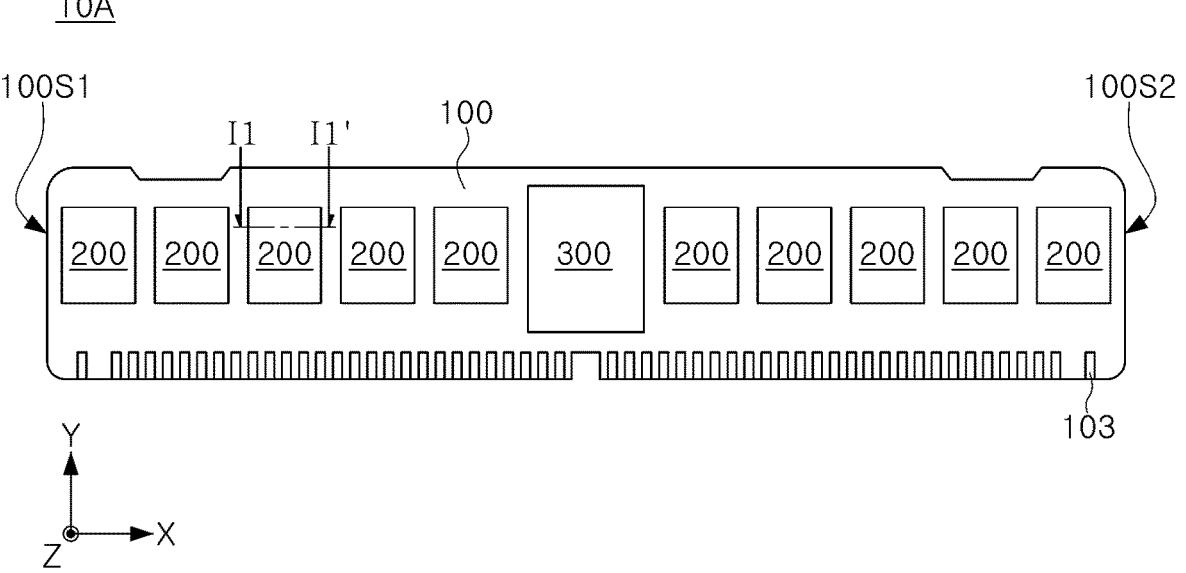
FIG. 1 is a plan view illustrating a memory module according to an example embodiment of the present inventive concept.

FIG. 1 is a plan view illustrating a memory module 10A according to an example embodiment of the present inventive concept.

Referring to FIG. 1, a memory module 10A according to an example embodiment may include a module substrate 100, a memory device (or a 'semiconductor package') 200, and a control device 300.

The module substrate 100 is a support substrate on which the memory device 200 and the control device 300 are mounted, and may include a printed circuit board (PCB), a ceramic substrate, a glass substrate, a tape interconnection board, and the like. For example, the module substrate 100 has a shape extending in a first direction (X-axis direction), and a plurality of memory devices 200 may be arranged between a first edge 100S1 and a second edge of the module substrate 100 opposing in the first direction (X-axis direction) to form at least one row, as illustrated. The module substrate 100 may include an external connection terminal 103 connected to an external device (e.g., a main board) and an interconnection circuit (not shown) electrically connecting the external connection terminal 103 to the memory device 200 and the control device 300.

The memory device 200 may be provided as a plurality of memory devices 200 arranged in at least one row between the first edge 100S1 and the second edge 100S2. The memory device 200 may be a volatile memory device such as dynamic RAM (DRAM), synchronous dynamic RAM (SDRAM), or static RAM (SRAM). However, the present inventive concept is not limited thereto, and the memory device 200 may be a non-volatile memory device such as a phase change RAM (PRAM), a magnetic RAM (MRAM), or a resistive RAM (RRAM). The memory device 200 may be a semiconductor package including a volatile or nonvolatile memory semiconductor chip and a redistribution substrate (or 'package substrate') for redistribution thereof.

The control device 300 may transmit an address command, a control command, and the like to the memory device 200. The memory device 200 may store or output data based on a command received from the control device 300.

As described above, since a memory module 10A includes a plurality of memory devices 200 operating at high speed, it is necessary to dissipate heat generated by the memory devices 200 externally in order to maintain performance and reliability of the memory module 10A. According to the present inventive concept, by introducing dummy bumps (hereinafter, 'second connection bumps') ('215b' in FIG. 2A) having a step difference with respect to connection bumps (hereinafter, 'first connection bumps') ('215a' in FIG. 2A) connected to an interconnection circuit (not shown) of the module substrate 100, below the memory devices 200, while maintaining a ball layout of the memory devices 200 conforming to an international standard (JEDEC standard), heat generated by the memory devices 200 may be dissipated through the module substrate 100. Hereinafter, components forming a physical and electrical connection structure in the memory module 10A will be described with reference to FIG. 2A and the like.

Figure 2A:
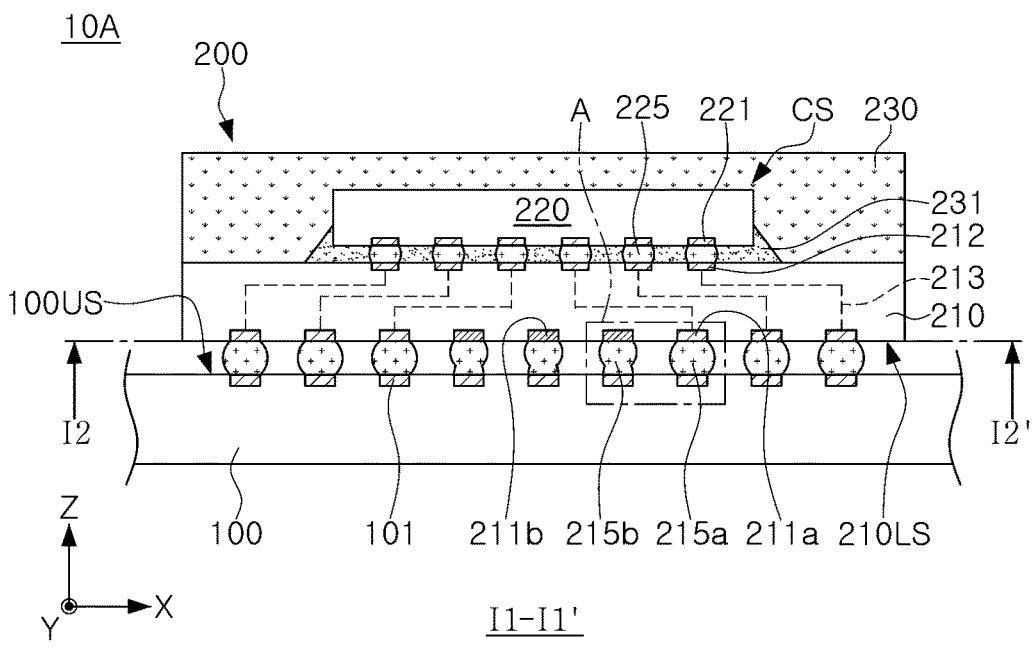
FIG. 2A is a cross-sectional view illustrating a cross-section taken along line I1-I1' of FIG. 1.
Figure 2B:
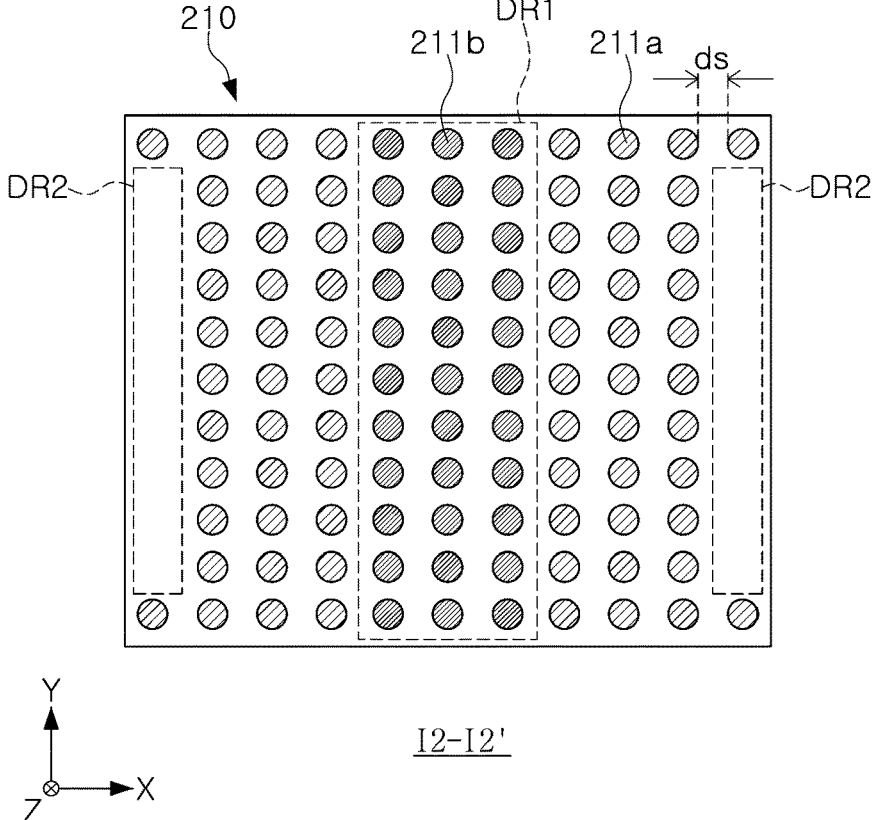
FIG. 2B is a cross-sectional view illustrating a cross-section taken along line I2-I2' of FIG. 2A.
Figure 2C:
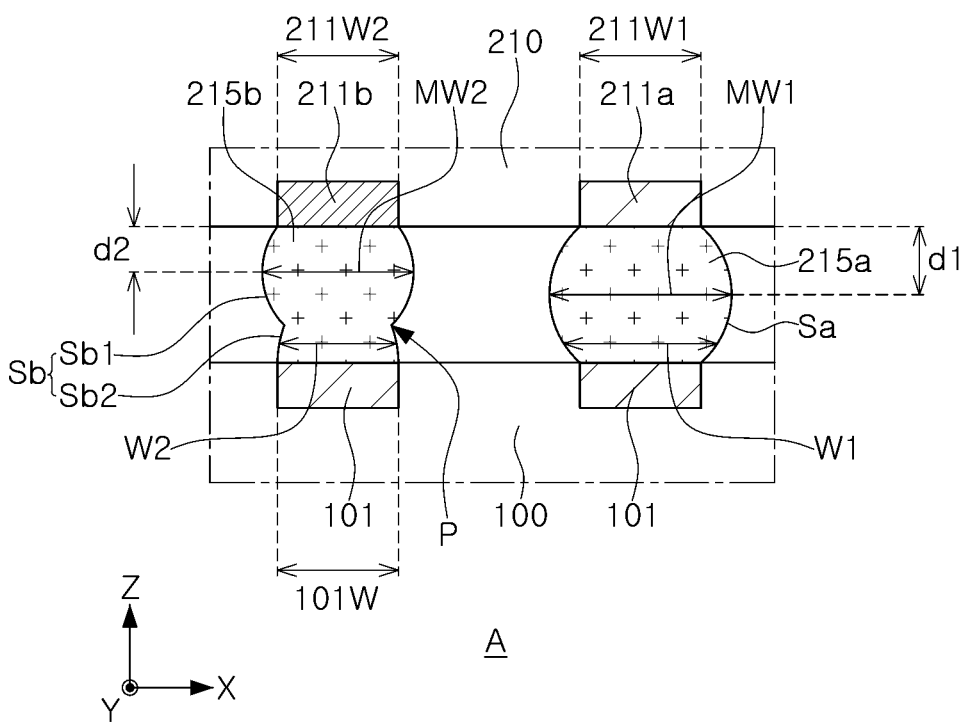
FIG. 2C is a partially enlarged view illustrating region 'A' of FIG. 2A.
Figure 2D:
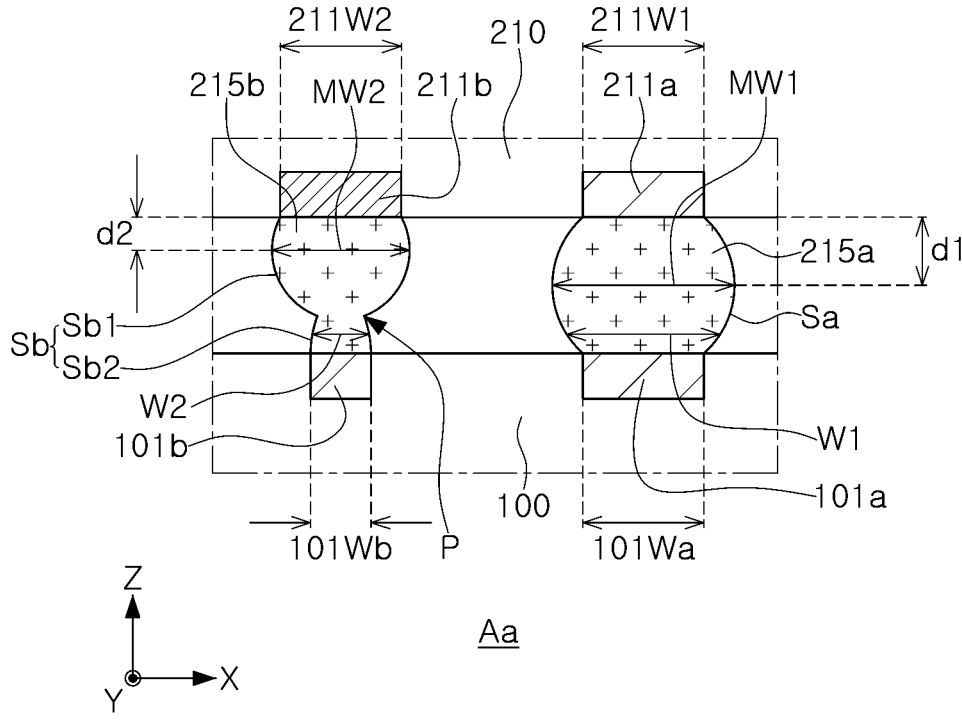
FIG. 2D is a partially enlarged view illustrating a modified example of the portion illustrated in FIG. 2C.

FIG. 2A is a cross-sectional view illustrating a cross-section taken along the line I1-I1' in FIG. 1, FIG. 2B is a cross-sectional view illustrating a cross-section taken along the line I2-I2' of FIG. 2A, FIG. 2C is a partially enlarged view illustrating region 'A' of FIG. 2A, and FIG. 2D is a partially enlarged view illustrating a modified example of the portion illustrated in FIG. 2C.

Referring to FIGS. 2A to 2D, a module substrate 100 and a semiconductor package (or a 'memory device') 200 may be physically and electrically connected through a plurality of connection bumps 215a and 215b.

The module substrate 100 may be a printed circuit board formed of a thermosetting resin such as an epoxy resin, a thermoplastic resin such as polyimide, or an insulating material such as prepreg including inorganic fillers or/and glass fibers, for example, prepreg, Ajinomoto Build-up Film (ABF), FR-4, or the like. The module substrate 100 may include landing pads 101 electrically connected to the semiconductor package 200 and an interconnection circuit (not shown) electrically connecting the landing pads 101 to the external connection terminal (103' in FIG. 1). The landing pads 101 and the interconnection circuit (not shown) may include at least one metal of copper (Cu), aluminum (Al), nickel (Ni), silver (Ag), gold (Au), platinum (Pt), and tin (Sn), lead (Pb), titanium (Ti), chromium (Cr), palladium (Pd), indium (In), zinc (Zn), and carbon (C) or alloys thereof.

The semiconductor package 200 may be disposed on an upper surface 100US of the module substrate 100, and may include a package substrate 210, a chip structure CS, and an encapsulant 230.

The package substrate 210 may be a printed circuit board (PCB) on which a chip structure CS is mounted. The package substrate 210 may include lower pads 211a and 211b, upper pads 212, and a redistribution circuit 213. For example, the package substrate 210 has a lower surface 210LS on which lower pads 211a of a first group and lower pads 211b of a second group are disposed, and an upper surface on which upper pads 212 are disposed. The upper pads 212 may be electrically connected to the lower pads 211a of the first group through a redistribution circuit 213. The upper pads 212 may be formed to have a lower pitch than the lower pads 211a and 211b. The redistribution circuit 213 may include, for example, a signal pattern, a power pattern, and a ground pattern. The lower pads 211a and 211b, the upper pads 212, and the redistribution circuit 213 may include a conductive material, for example, at least one metal of copper (Cu), aluminum (Al), nickel (Ni), silver (Ag), gold (Au), platinum (Pt), and tin (Sn), lead (Pb), titanium (Ti), chromium (Cr), palladium (Pd), indium (In), zinc (Zn), and carbon (C) or alloys thereof.

The lower pads 211a of the first group may be connection pads providing a transmission path of a signal (e.g., a data signal, a power signal, and the like) of a chip structure CS, and the lower pads 211b of the second group may be dummy pads electrically insulated from the chip structure CS. Accordingly, in some embodiments, the lower pads 211b of the second group may not be connected to the upper pads 212. However, according to some example embodiments, the lower pads 211b of the second group may be connected to the upper pads 212 to provide a transmission path of a power signal or a ground signal of the chip structure CS. That is, the lower pads 211a of the first group may be connected to a signal pattern, a power pattern, or a ground pattern of the redistribution circuit 213, and at least a portion of the lower pads 211b of the second group may be connected to the power pattern, or the ground pattern of the redistribution circuit 213.

The lower pads 211a of the first group may be disposed to correspond to a ball layout according to a JEDEC standard. The lower pads 211b of the second group may be disposed in a region in which the lower pads 211a of the first group are not disposed. For example, as illustrated in FIG. 2B, the package substrate 210 may have a first dummy region DR1 extending to both sides of the package substrate 210 opposing a central portion of a lower surface thereof, and at least a portion of lower pads 211*b* of the second group may be arranged in a matrix form in the first dummy region DR1. In this case, the lower pads 211*a* of the first group may be symmetrically arranged on both sides of the first dummy region DR1. However, the arrangement of the lower pads 211*a* of the first group and the lower pads 211*b* of the second group is not limited to those illustrated in the drawings. In example embodiments, at least a portion of the lower pads 211*b* of the second group may be disposed in a second dummy region DR2, adjacent to an edge of the package substrate 210. In an example embodiment, a separation distance between the lower pads 211*b* of the second group may be similar to a separation distance ds of the lower pads 211*a* of the first group. For example, the separation distance ds between the lower pads 211*a* of the first group may be in a range of about 0.3 mm to about 1.2 mm, about 0.5 mm to about 1 mm, or about 0.8 mm to about 1 mm. However, according to an example embodiment, the shape, diameter, and separation distance of the lower pads 211*b* of the second group may be different from those of the lower pads 211*a* of the first group.

The chip structure CS may include at least one semiconductor chip 220 disposed on an upper surface of the package substrate 210. The semiconductor chip 220 may be electrically connected to upper pads 212 of the package substrate 210. The semiconductor chip 220 may be a memory chip including a DRAM device, an SDRAM device, an RRAM device, a PRAM device, an MRAM device, a Spin Transfer Torque MRAM (STT-MRAM) device, or the like. The chip structure CS may be mounted on the package substrate 210 in a flip-chip method. For example, a bump structure 225 electrically connecting the connection terminals 221 of the semiconductor chip 220 and the upper pads 212 of the package substrate 210 may be disposed between the chip structure CS and the package substrate 210. The bump structure 225 may have a form of a ball, a pin, or a lead. For example, the bump structure 225 may have a form in which a solder ball and a copper (Cu) pillar are combined.

The encapsulant 230 may be disposed on the package substrate 210, and may encapsulate at least a portion of the chip structure CS. The encapsulant 230 may include, for example, a thermosetting insulating resin such as an epoxy resin, a thermoplastic insulating resin such as a polyimide, or prepreg including an inorganic filler and/or a glass fiber, an Ajinomoto Build-up Film (ABF), FR-4, a bismaleimide triazine (BT) resin, an epoxy molding compound (EMC). An underfill member 231 surrounding the bump structure 225 may be disposed between the chip structure CS and the package substrate 210. The underfill member 231 may have a capillary underfill (CUF) structure in which a boundary thereof with the encapsulant 230 is separated, but according to example embodiments, may have a molded underfill (MUF) structure integrally formed with the encapsulant 230.

The plurality of connection bumps 215*a* and 215*b* may include first connection bumps 215*a* connecting the lower pads 211*a* of the first group to the landing pads 101 of the module substrate 100, and second connection bumps 215*b* connecting the lower pads 211*b* second group to the landing pads 101 of the module substrate 100. The plurality of connection bumps 215*a* and 215*b* may be formed of a low-melting-point metal, such as tin (Sn), indium (In), bismuth (Bi), antimony (Sb), copper (Cu), silver (Ag), zinc (Zn), lead (Pb), or alloys thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

In the present inventive concept, by forming heights of first preliminary bumps ('215*p*1' in FIG. 3B) forming first connection bumps 215*a* and second preliminary bumps (215*p*2' in FIG. 3B) forming second connection bumps 215*b* differently (to be described later with reference to FIGS. 3A and 3B), dummy bumps (second connection bumps) improving heat dissipation characteristics of the memory module 10A may be introduced without affecting a subsequent process (e.g., electrical inspection, or the like). Accordingly, the first connection bumps 215*a* and the second connection bumps 215*b* of the present inventive concept may have different vertical cross-sectional shapes or side shapes.

For example, as illustrated in FIG. 2C, the first connection bumps 215*a* may have a first side surface Sa extending from the lower pads 211*a* of the first group to an upper surface of the module substrate 100 to have a first maximum width MW1 at a first distance d1, respectively (i.e., the first distance d1 is from the package substrate lower surface 210LS). In addition, the second connection bumps 215*b* may have a second side surface Sb including an upper portion Sb1 extending from the lower pads 211*b* of the second group to one point between an upper surface of the module substrate 100 and a lower surface of the package substrate 210 and a lower portion Sb2 extending from the one point P to an upper surface of the module substrate 100 to have a second maximum width MW2 at a second distance d2, respectively, (i.e., the first distance d2 is from the package substrate lower surface 210LS). That is, the first maximum width MW1 of the first connection bumps 215*a* and the second maximum width MW2 of the second connection bumps 215*b* may be located on different levels. For example, the second maximum width MW2 may be located on a level, more adjacent (i.e., closer) to a lower surface of the package substrate 210 than the first maximum width MW1.

Here, the first side surface Sa of a first connection bump 215*a* may be a curved surface extending from the lower pads 211*a* of the first group to the landing pad 101 of the module substrate 100. An upper portion Sb1 of a second side surface Sb of a second connection bump 215*b* may be a curved surface convexly extending from the lower pads 211*b* of the second group to one point P, and a lower portion Sb2 of the second side surface Sb may be a curved surface vertically extending from the one point P to the landing pad 101 of the module substrate 100, as illustrated in FIG. 2C. The lower portion Sb2 of the second side surface Sb is not physically perpendicular to an upper surface of the module substrate 100, which means a curved surface having a relatively small curvature compared to the upper portion Sb1 of the second side surface Sb.

The second connection bumps 215*b* may have an upper region surrounded by an upper portion Sb1 of the second side surface Sb and a lower region surrounded by a lower portion Sb2 of the second side surface Sb. The upper region and the lower region may be divided based on one point P of the second side surface Sb. One point P of the second side surface Sb is located closer to the landing pads 101 of the module substrate 100 than to the lower pads 211*b* of the second group, and the second connection bumps 251*b* may have a second maximum width MW2 in the upper region positioned above the one point P.

For example, the first connection bumps 215*a* may have a first maximum width MW1 in a direction, parallel to a lower surface 210LS in a position spaced apart from the lower surface 210LS of the package substrate 210 by a first distance d1 (or the lower pads 211*a* of the first group) (e.g. X-axis direction), and the second connection bumps 215*b* may have a second maximum width MW2 in a direction, parallel to a lower surface 210LS in a position spaced apart from the lower surface 210LS of the package substrate 210 by a second distance d2, shorter than the first distance d1 (or the lower pads 211b of the second group) (e.g., X-axis direction). The second maximum width MW2 may be located closer to the lower surface 201LS of the package substrate 210 than the first maximum width MW1. For example, when a distance between the lower pads 211a of the first group and the landing pad 101 is in a range of about 300 μm to about 400 the first distance d1 may be in a range of about 100 μm to about 200 μm, about 120 μm to about 180 and about 140 μm to about 160 and the second distance d2 may be shorter than the first distance d1.

In addition, the lower region of the second connection bumps 251b may have a second width W2 equal to or smaller than the first width W1 of the first connection bumps 215a of the same level in a lower region located below one point P, as illustrated in FIG. 2C. That is, in the first connection bumps 215a, while the first width W1 continuously increases from an upper surface 100US of the module substrate 100 (or the landing pad 101) to a point at which the first maximum width MW1 is formed, in the second connection bumps 251b, a second width W2 may be reduced from the upper surface 100US of the module substrate (or the landing pad 101) to one point P, an uppermost end of the lower region. However, depending on example embodiments, the second width W2 at one point P may not necessarily be the minimum, and the second width W2 at the one point P may be greater than the width 101W of the landing pad 101. For example, a difference between the first width W1 of the first connection bumps 215a and the first maximum width MW1 and a difference between the second width W2 of the second connection bumps 215b and the second maximum width MW2.

In the present example embodiment, the lower pads 211b of the second group may have a width 211W2, less than or substantially equal to the width 211W1 of the lower pads 211a of the first group, and a second maximum width. (MW2) may be substantially less than or equal to the first maximum width (MW1), as illustrated in FIG. 2C. For example, the widths 211W1 and 211W2 of the lower pads 211a and 211b may range from about 250 μm to about 450 μm, or from about 300 μm to about 400 μm. The first maximum width MW1 may be determined according to a size of a preliminary solder ball and a reflow process condition. For example, the first maximum width MW1 of a first connection bump 215a may range from about 300 μm to about 500 μm, or from about 350 μm to about 450 μm. The second maximum width MW2 of a second connection bump 215b may range from about 60% to about 100%, from about 70% to about 100%, from about 70% to about 90% of the first maximum width MW1. However, the widths 211W1 and 211W2 of the lower pads 211a and 211b and the first and second maximum widths MW1 and MW2 are not necessarily limited to the above-described range.

For example, referring to the modified example of FIG. 2D, a width 101Wb of the second landing pad 101b, in contact with the second connection bumps 215b, may be narrower than a first width 101Wa of the first landing pad 101a, in contact with the first connection bumps 215a. In this case, the second connection bumps 215b may have a second maximum width MW2, narrower than a first maximum width MW1 of the first connection bumps 215a. As an example, the second maximum width MW2 may be in a range of about 70% to about 99%, from about 70% to about 95%, or from about 70% to about 90% of the first maximum width MW1.

Figure 3A:
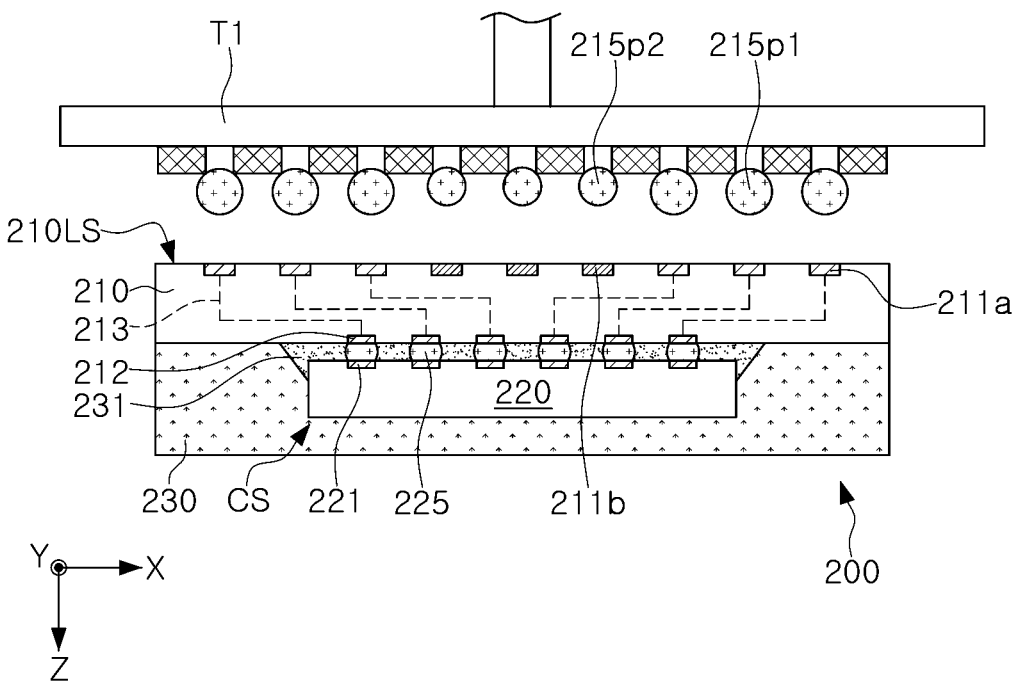
FIGS. 3A and 3B are cross-sectional views illustrating a process of coupling the semiconductor package and the module substrate of FIG. 2A.
Figure 3B:
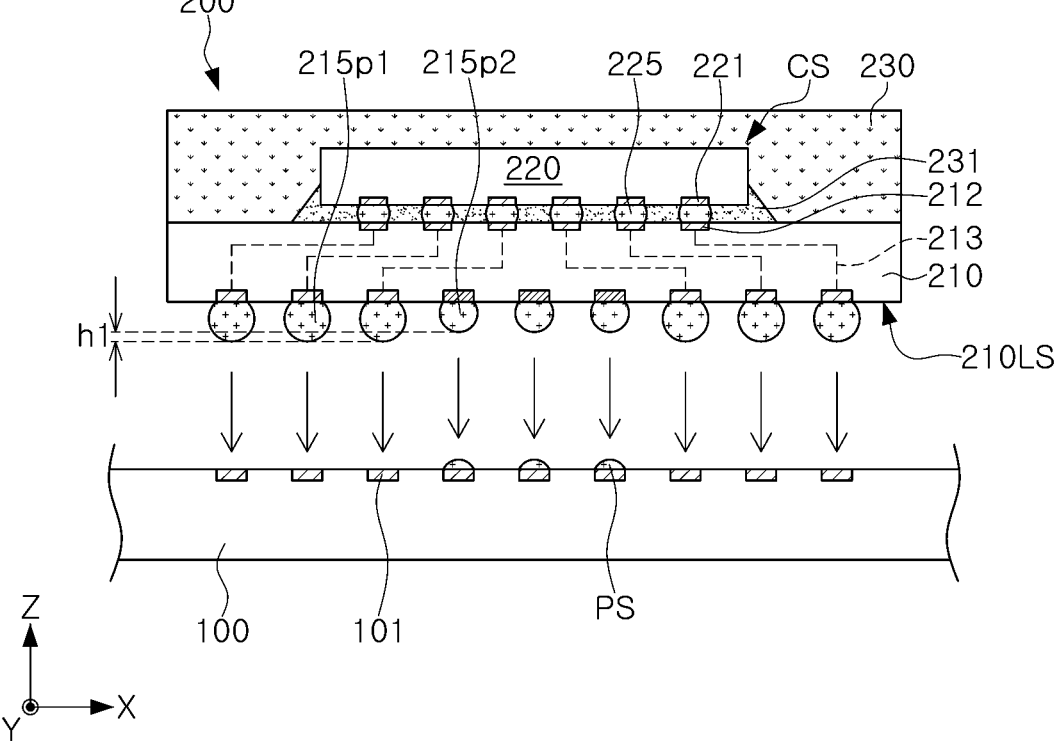

FIGS. 3A and 3B are cross-sectional views illustrating a process of coupling the semiconductor package 200 and the module substrate 100 of FIG. 2A.

Referring to FIG. 3A, a plurality of preliminary bumps 215p1 and 215p2 may be attached to the package substrate 210 of the semiconductor package 200. The plurality of preliminary bumps 215p1 and 215p2 may be dropped on lower pads 211a of a first group and lower pads 211b of a second group using a pickup tool T1. In an example embodiment, when sizes or areas of the lower pads 211a of the first group and the lower pads 211b of the second group are substantially the same, a step may be formed by varying sizes of the plurality of preliminary bumps 215p1 and 215p2. That is, a volume of the second preliminary bumps 215p2 corresponding to the lower pads 211b of the second group may be about 20% or more smaller than a volume of the first preliminary bumps 215p1 corresponding to the lower pads 211a of the first group. For example, the volume of the second preliminary bumps 215p2 may be in a range of about 50% to about 80%, or about 60% to about 70% of the volume of the first preliminary bumps 215p1.

Referring to FIG. 3B, the semiconductor package 200 to which the plurality of preliminary bumps 215p1 and 215p2 are attached may be disposed on the module substrate 100. The second preliminary bumps 215p2 may have a height, smaller than the height of the first preliminary bumps 215p1. A height difference h1 between the second preliminary bumps 215p2 and the first preliminary bumps 215p1 may be in a range of about 50 μm or more, for example, about 50 μm to about 150 μm, about 80 μm to about 120 μm, or about 90 μm to about 110 μm. Accordingly, the second preliminary bumps 215p2 may not affect a subsequent process. For example, the second preliminary bumps 215p2 may not come into contact with an inspection probe in an electrical inspection using the first preliminary bumps 215p1. A conductive material PS may be coated on the landing pads 101 of the module substrate 100 corresponding to the second preliminary bumps 215p2. The conductive material PS may be a solder ball or solder paste including a low-melting-point metal such as tin (Sn) and alloys thereof. The conductive material PS may include an alloy having a composition ratio different from that of the second preliminary bumps 215p2. A flux (not shown) may be applied on the landing pads 101 and the conductive material PS. The conductive material PS may be integrated with the second preliminary bumps 215p2 in a subsequent reflow process to form the second connection bumps 215b, particularly, a lower region (refer to 'Sb2' in FIG. 2C).

Figure 4A:
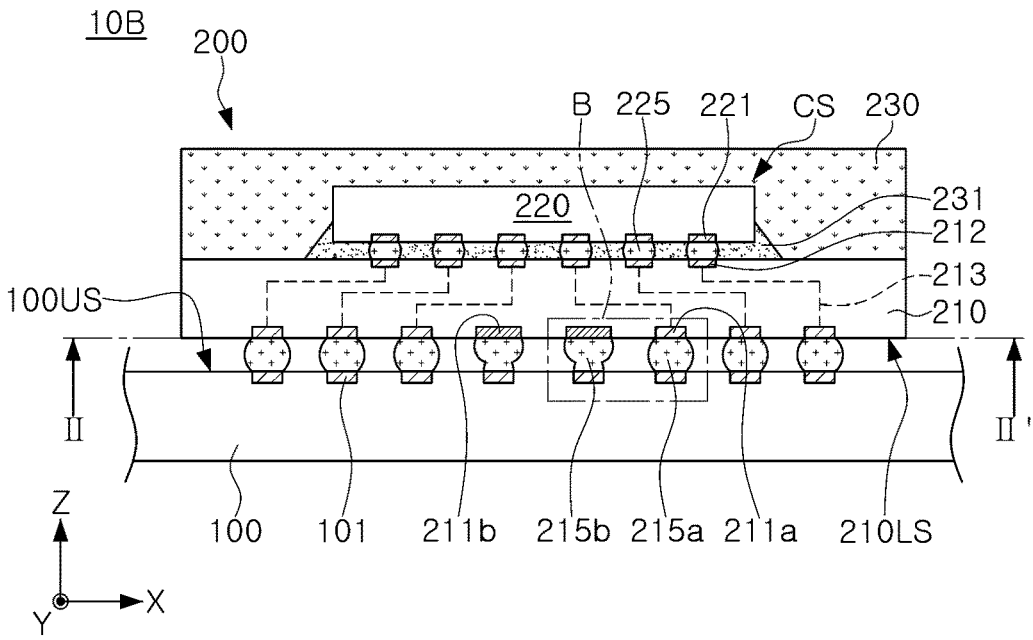
FIG. 4A is a cross-sectional view illustrating a memory module according to an example embodiment of the present inventive concept.
Figure 4B:
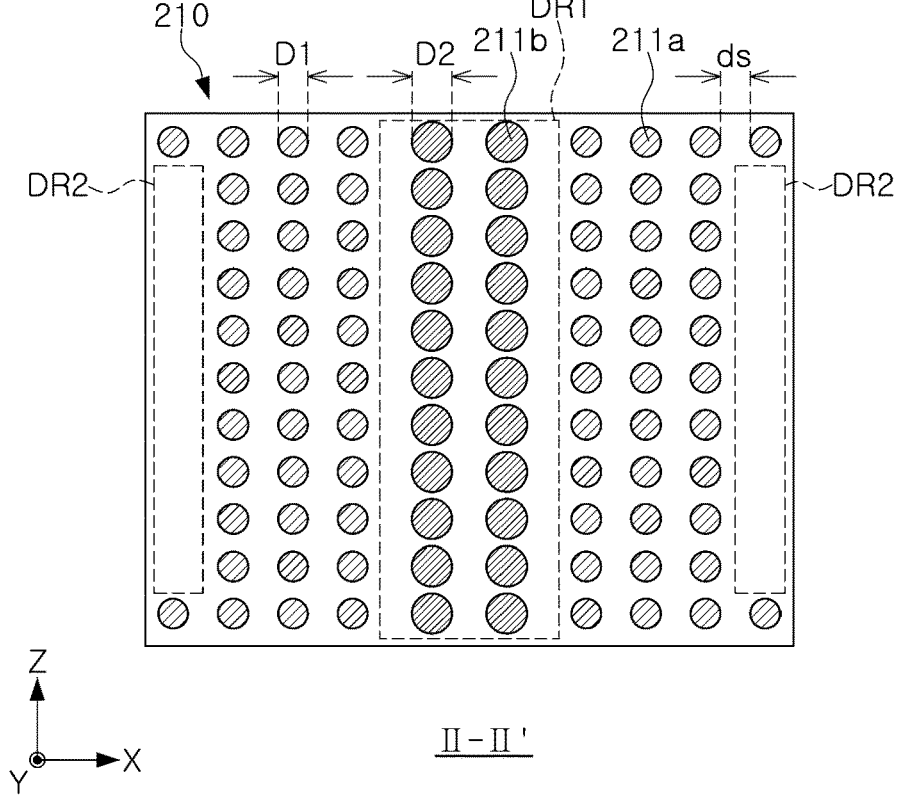
FIG. 4B is a cross-sectional view taken along the line II-II' of FIG. 4A.
Figure 4C:
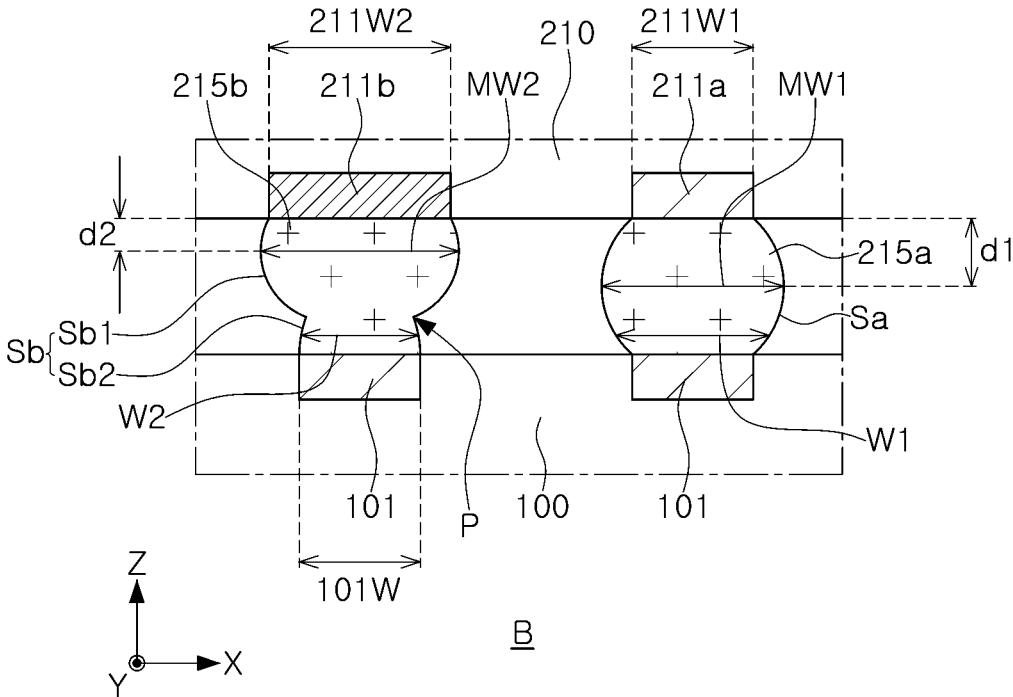
FIG. 4C is a partially enlarged view illustrating region 'B' of FIG. 4A.

FIG. 4A is a cross-sectional view illustrating a memory module 10B according to an example embodiment of the present inventive concept, FIG. 4B is a cross-sectional view taken along line II-II' of FIG. 4A, and FIG. 4C is a partially enlarged view illustrating region 'B' of FIG. 4A.

Referring to FIGS. 4A to 4C, the memory module 10B according to an example embodiment may have the same or similar characteristics as those described with reference to FIGS. 1 to 2D, except for including lower pads 211b of a second group having a width 211W2, wider than a width 211W1 of lower pads 211a of a first group in a direction, parallel to a lower surface 210LS of the package substrate 210 (e.g. in an X-axis direction).

In the present example embodiment, the lower pads 211b of the second group may have a second diameter D2, greater than a first diameter D1 of the lower pads 211a of the first group, and a second maximum width (MW2) may be greater than a first maximum width (MW1). That is, on a plane (X-Y plane), an area of the lower pads 211b of the second group, in contact with second connection bumps 215b, may be greater than an area of the lower pads 211a of the first group, in contact with the first connection bumps 215a. For example, a planar area of the lower pads 211b of the second group may be 20% or more, greater than a planar area of the lower pads 211a of the first group. For example, the planar area of the lower pads 211b of the second group may be in a range from about 120% to about 160%, or from about 120% to about 140% of the planar area of the lower pads 211a of the first group.

Figure 5A:
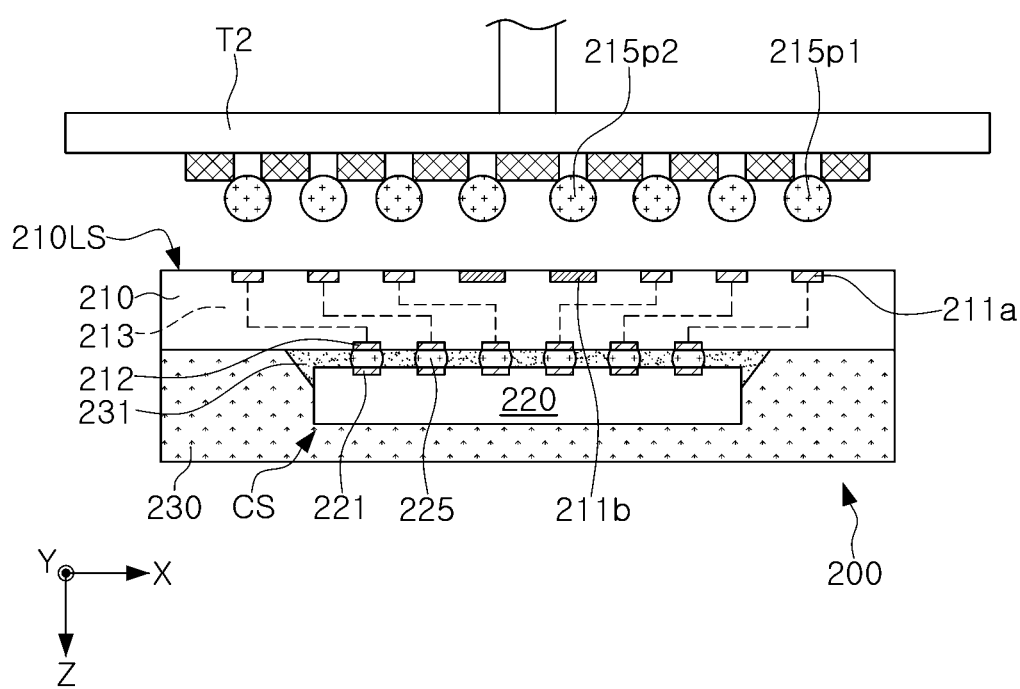
FIGS. 5A and 5B are cross-sectional views illustrating a process of coupling the semiconductor package and the module substrate of FIG. 4A.
Figure 5B:
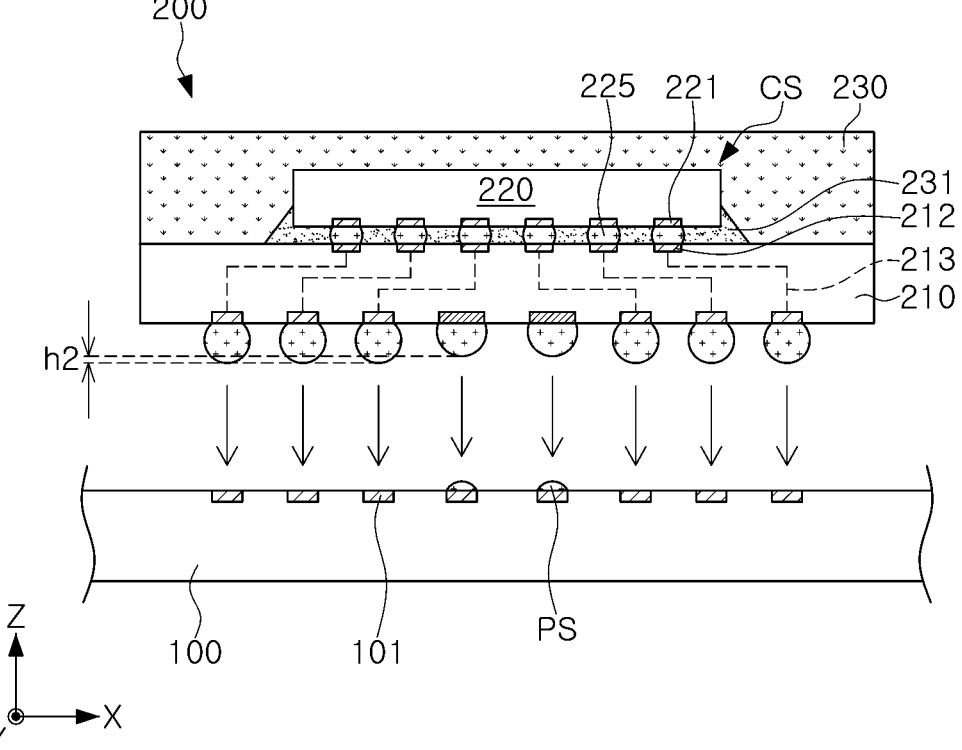

FIGS. 5A and 5B are cross-sectional views illustrating a process of coupling the semiconductor package 200 and the module substrate 100 of FIG. 4A.

Referring to FIG. 5A, a plurality of preliminary bumps 215p1 and 215p2 may be attached to the package substrate 210 of the semiconductor package 200. The plurality of preliminary bumps 215p1 and 215p2 may be dropped on the lower pads 211a of the first group and the lower pads 211b of the second group using a pickup tool T2. In an example embodiment, when an area of the lower pads 211a of the first group, in contact with the first preliminary bumps 215p1 is greater than an area of the lower pads 211b of the second group, in contact with the second preliminary bumps 215p2, the first preliminary bumps 215p1 and the second preliminary bumps 215p2 respectively attached on the lower pads 211a of the first group and the lower pads 211b of the second group may have a step difference. That is, the first preliminary bumps 215p1 and the second preliminary bumps 215p2 are solder balls having the same volume, but since a wetting area of the second preliminary bumps 215p2 is relatively large, the second preliminary bumps 215p2 may be formed to have a lower height than the first preliminary bumps 215p1.

Referring to FIG. 5B, the semiconductor package 200 to which the plurality of preliminary bumps 215p1 and 215p2 are attached may be disposed on the module substrate 100. The second preliminary bumps 215p2 may have a height, lower than the height of the first preliminary bumps 215p1. A height difference h2 between the second preliminary bumps 215p2 and the first preliminary bumps 215p1 may be in a range about 50 μm or more, for example, from about 50 μm to about 150 from about 80 μm to about 120 or from about 90 μm to about 110 Accordingly, the second preliminary bumps 215p2 may not come into contact with a probe for inspection in an electrical inspection using the first preliminary bumps 215p1. A solder ball including a low-melting-point metal and alloys thereof or a conductive material PS including a solder paste may be coated on the landing pads 101 of the module substrate 100 corresponding to the second preliminary bumps 215p2. The conductive material PS may include an alloy having a composition ratio different from that of the second preliminary bumps 215p2. A flux (not shown) may be applied on the landing pads 101 and the conductive material PS. The conductive material PS may be integrated with the second preliminary bumps 215p2 in a subsequent reflow process to form the second connection bumps 215b, particularly, a lower region (refer to 'Sb2' in FIG. 4C).

Figure 6:
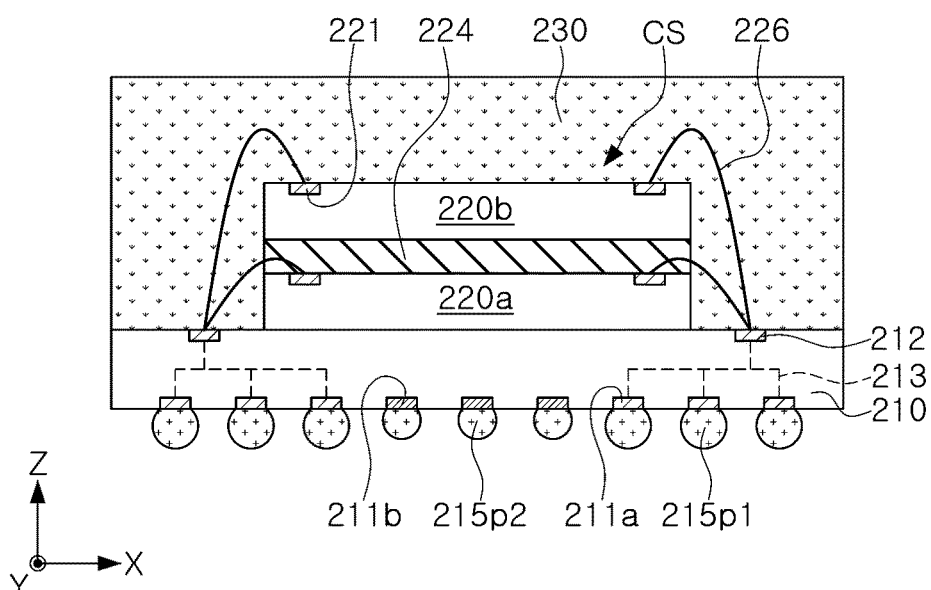
FIGS. 6 and 7 are cross-sectional views illustrating example semiconductor packages applicable to the memory module of the present inventive concept.
Figure 7:
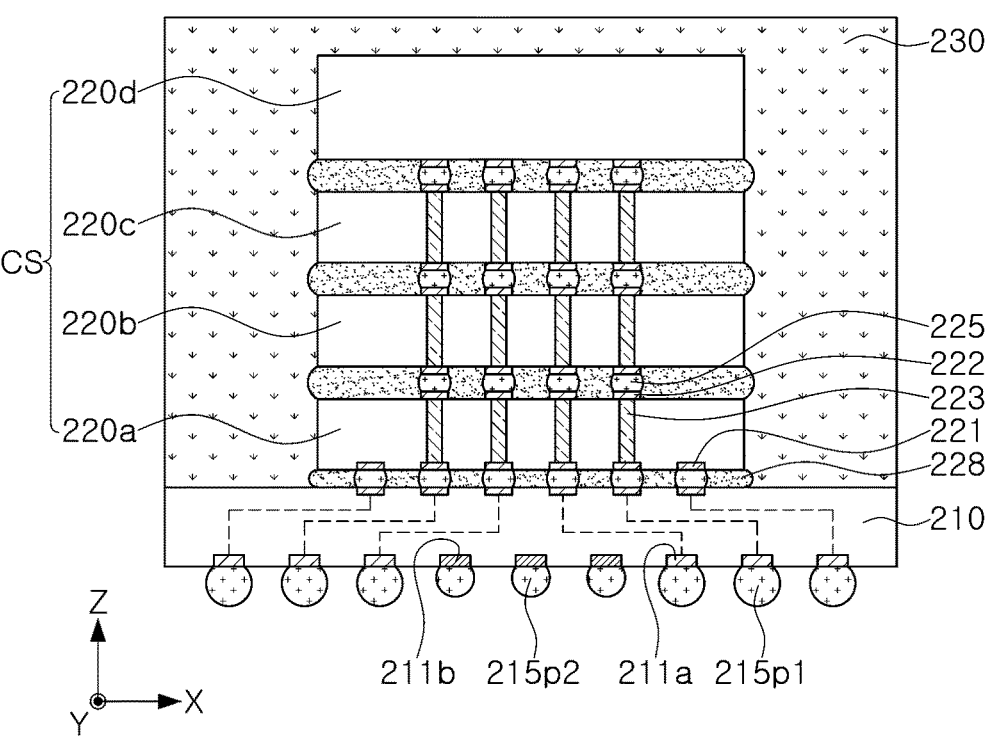

FIGS. 6 and 7 are cross-sectional views illustrating example semiconductor packages 200a and 200b applicable to a memory module of the present inventive concept.

Referring to FIG. 6, a semiconductor package 200a in an example may include a chip structure CS including a plurality of semiconductor chips 220a and 220b mounted on a package substrate 210 by wire-bonding. The plurality of semiconductor chips 220a and 220b may be memory chips including a DRAM device, an SDRAM device, an RRAM device, a PRAM device, an MRAM device, or a Spin Transfer Torque MRAM (STT-MRAM) device. The plurality of semiconductor chips 220a and 220b may be provided in a number less than or greater than that shown in the drawings. Each of the semiconductor chips 220a and 220b may include connection terminals 221 electrically connected to the upper pads 212 of the package substrate 210 through bonding wires 226. The bonding wire 226 may include gold (Au), silver (Ag), lead (Pb), aluminum (Al), copper (Cu), or alloys thereof, but an example embodiment thereof is not limited thereto. An adhesive member 224 may be interposed between the plurality of semiconductor chips 220a and 220b. The adhesive member 224 may include an insulating film, for example, a die attach film (DAF).

Referring to FIG. 7, a semiconductor package 200b in an example may include a chip structure CS including a plurality of semiconductor chips 220a, 220b, 220c, and 220d electrically connected to each other through a through-electrode 223. The plurality of semiconductor chips 220a, 220b, 220c, and 220d may include the above-described memory chip. The plurality of semiconductor chips 220a, 220b, 220c, and 220d may be provided in a number less than or greater than that illustrated in the drawings. The upper-most semiconductor chips 220a, 220b, and 220c excluding the semiconductor chip 220d may include a through electrode 223 electrically connecting the lower connection terminal 221 and the upper connection terminal 222, respectively. The through-electrode 223 may include a metal such as tungsten (W), titanium (Ti), aluminum (Al), or copper (Cu). The through-electrode 223 may be surrounded by a side insulating film (not shown). A bump structure 225 electrically connecting the lower connection terminal 221 and the upper connection terminal 222 between the plurality of semiconductor chips 220a, 220b, 220c, and 220d, and an insulating adhesive film 228 surrounding the bump structure 225 may be disposed. The bump structure 225 may include solder balls and/or copper (Cu) pillars. The insulating adhesive film 228 may include, for example, a non-conductive film (NCF).

As set forth above, according to example embodiments of the present inventive concept, by introducing dummy bumps between a package module and a module substrate, a memory module having improved heat dissipation characteristics may be provided.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction toward the mounting surface. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A memory module, comprising:
   a module substrate;
   at least one semiconductor package on the module substrate, the at least one semiconductor package comprising:
   a package substrate comprising a lower surface and an upper surface;
   first and second groups of lower pads on the package substrate lower surface;
   upper pads on the package substrate upper surface, the upper pads electrically connected to the lower pads of the first group;
   a chip structure on the package substrate upper surface and electrically connected to the upper pads; and
   an encapsulant sealing at least a portion of the chip structure;
   first connection bumps connecting the lower pads of the first group to the module substrate; and
   second connection bumps connecting the lower pads of the second group to the module substrate,
   wherein the first connection bumps each have a first maximum width at a first distance from the package substrate lower surface,
   wherein the second connection bumps each have a second maximum width at a second distance from the package substrate lower surface, wherein the second distance is shorter than the first distance,
   wherein the second connection bumps each further have a minimum width at a third distance from the package substrate lower surface, wherein the third distance is greater than the first distance,
   wherein the second connection bumps each further have a middle width at a fourth distance from the package substrate lower surface, wherein the fourth distance is greater than the third distance, and
   wherein the middle width is greater than the minimum width, and smaller than the second maximum width.

2. The memory module of claim 1, wherein a lower portion of each of the first connection bumps, adjacent to the module substrate, has a first width, and a lower portion of each of the second connection bumps, adjacent to the module substrate, has a second width, narrower than the first width.

3. The memory module of claim 2, wherein a difference between the first width of each of the first connection bumps and the first maximum width of each of the first connection bumps is greater than a difference between the second width of each of the second connection bumps and the second maximum width of each of the second connection bumps.

4. The memory module of claim 1, wherein the package substrate further comprises a redistribution circuit electrically connecting the lower pads of the first group and the upper pads.

5. The memory module of claim 4, wherein the redistribution circuit comprises a signal pattern, a power pattern, and a ground pattern, wherein the lower pads of the first group are connected to the signal pattern, the power pattern, or the ground pattern, wherein at least some of the lower pads of the second group are connected to the power pattern or the ground pattern.

6. The memory module of claim 1, wherein each of the first connection bumps has a convex configuration, wherein each of the second connection bumps has a convexly shaped upper portion extending from the lower pads of the second group, and a lower portion extending from the upper portion to the upper surface of the module substrate, wherein the upper portion has a maximum width that is greater than a width of the lower portion.

7. The memory module of claim 6, wherein the convexly shaped upper portion has the second maximum width.

8. The memory module of claim 1, wherein the lower pads of the second group each have a width that is greater than a width of each of the lower pads of the first group.

9. The memory module of claim 8, wherein the second maximum width is greater than the first maximum width.

10. The memory module of claim 1, wherein the lower pads of the second group each have a width that is less than or substantially equal to a width of each of the lower pads of the first group.

11. The memory module of claim 10, wherein the second maximum width is equal to or less than the first maximum width.

12. The memory module of claim 1, wherein the chip structure comprises at least one memory chip.

13. The memory module of claim 12, wherein the memory chip comprises a dynamic RAM device, a synchronous DRAM device, a resistive RAM device, a phase RAM device, a magnetic RAM device, or a spin transfer torque MRAM device.

14. The memory module of claim 1, wherein the first and second connection bumps comprise tin (Sn), indium (In), bismuth (Bi), antimony (Sb), copper (Cu), silver (Ag), zinc (Zn), lead (Pb), or alloys thereof.

15. The memory module of claim 1, wherein the package substrate further comprises a dummy region, the lower pads of the second group are in the dummy region, and the lower pads of the first group are on opposite sides of the dummy region.

16. A memory module, comprising:
   a module substrate;
   at least one semiconductor package on the module substrate, the at least one semiconductor package comprising:
   a package substrate comprising a lower surface and an upper surface;
   first and second groups of lower pads on the package substrate lower surface;

upper pads on the package substrate upper surface, the upper pads electrically connected to the lower pads of the first group; and a chip structure on the package substrate upper surface and electrically connected to the upper pads;

first connection bumps connecting the lower pads of the first group to the module substrate, each of the first connection bumps having a first maximum width; and second connection bumps connecting the lower pads of the second group to the module substrate, each of the second connection bumps having a second maximum width, wherein the first maximum width of each first connection bump is at a first distance from the lower surface of the package substrate, wherein the second maximum width of each second connection bump is at a second distance from the lower surface of the package substrate, wherein the second distance is different from the first distance, wherein the second connection bumps each further have a minimum width at a third distance from the package substrate lower surface, wherein the third distance is greater than the first distance, wherein the second connection bumps each further have a middle width at a fourth distance from the package substrate lower surface, wherein the fourth distance is greater than the third distance, and wherein the middle width is greater than the minimum width, and smaller than the second maximum width.

17. The memory module of claim 16, wherein the second distance is less than the first distance.

18. A memory module, comprising:

a module substrate comprising first and second landing pads;

a package substrate on the module substrate, the package substrate comprising an upper surface and a lower surface, wherein first and second groups of lower pads are on the lower surface, upper pads are on the upper surface, and wherein the upper pads are electrically connected to the lower pads of the first group;

a chip structure on the package substrate upper surface and electrically connected to the upper pads;

first connection bumps connecting the lower pads of the first group to the first landing pads of the module substrate, wherein the first connection bumps each have a first maximum width at a first distance from the package substrate lower surface; and second connection bumps connecting the lower pads of the second group to the second landing pads of the module substrate, wherein the second connection bumps each have a second maximum width at a second distance from the package substrate lower surface, wherein the second distance is shorter than the first distance, wherein the second connection bumps each further have a minimum width at a third distance from the package substrate lower surface, wherein the third distance is greater than the first distance, wherein the second connection bumps each further have a middle width at a fourth distance from the package substrate lower surface, wherein the fourth distance is greater than the third distance, and wherein the middle width is greater than the minimum width, and smaller than the second maximum width.

19. The memory module of claim 18, wherein each of the second connection bumps has a convexly shaped upper portion extending from a lower pad of the second group, and a lower portion extending from the upper portion to the second landing pads of the module substrate.

20. The memory module of claim 19, wherein the convexly shaped upper portion has a width greater than a width of the lower portion.

* * * * *